(12) United States Patent
Yang et al.

(10) Patent No.: US 7,453,761 B2
(45) Date of Patent: Nov. 18, 2008

(54) METHOD AND SYSTEM FOR LOW COST LINE BUFFER SYSTEM DESIGN

(75) Inventors: Genkun Jason Yang, Saratoga, CA (US); Jean-Huang Chen, Cupertino, CA (US); Richard H. Wyman, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 220 days.

(21) Appl. No.: 11/016,999

(22) Filed: Dec. 20, 2004

(65) Prior Publication Data

US 2005/0270300 A1    Dec. 8, 2005

Related U.S. Application Data

(60) Provisional application No. 60/577,814, filed on Jun. 8, 2004.

(51) Int. Cl.
*G06F 13/14* (2006.01)
(52) U.S. Cl. .............. 365/230.08; 710/53; 710/52; 365/230.04; 365/189.05; 711/168; 711/219
(58) Field of Classification Search .............. 345/560; 711/110
See application file for complete search history.

(56) References Cited

U.S. PATENT DOCUMENTS

| | | | | |
|---|---|---|---|---|
| 4,769,778 A | * | 9/1988 | Tielert et al. | 708/308 |
| 5,386,547 A | * | 1/1995 | Jouppi | 711/122 |
| 6,026,032 A | * | 2/2000 | Nordman et al. | 365/189.05 |
| 6,108,014 A | * | 8/2000 | Dye | 345/544 |
| 6,407,742 B1 | * | 6/2002 | Yeh et al. | 345/558 |
| 6,954,207 B2 | * | 10/2005 | Song et al. | 345/536 |
| 2002/0174304 A1 | * | 11/2002 | Wang et al. | 711/144 |

OTHER PUBLICATIONS

Kamp et al., "Programmable 2D Linear Filter for Video Applications", IEEE Journal of Solid-State Circuits, Jun. 1990, IEEE, vol. 2, Iss. 3, pp. 735-740.*
Zehner et al., "A CMOS VLSI Chip for Filtering of TV Pictures in Two Dimensions", IEEE Journal of Solid-State Circuits, Oct. 1986, IEEE, vol. 21, Issue 5, pp. 797-802.*
"The Merriam-Webster Dictionary", 2005, Merriam-Webster Inc., New Edition, pp. 113.*

* cited by examiner

*Primary Examiner*—B. James Peikari
(74) *Attorney, Agent, or Firm*—McAndrews, Held & Malloy, Ltd.

(57) ABSTRACT

Various aspects of the low cost line buffer system allow a reduction in circuitry versus conventional approaches to line buffer design. A plurality of line buffers such that the output of one line buffer in the plurality of line buffers may be coupled to an input of a succeeding line buffer in the plurality of line buffers. A first line buffer in the plurality of line buffers may be coupled to an input write data signal, while the width of a subsequent plurality of line buffers may be less than or equal to the width of the previous line buffers in the plurality of line buffers.

18 Claims, 8 Drawing Sheets

METHOD AND SYSTEM FOR LOW COST LINE BUFFER SYSTEM DESIGN

CROSS-REFERENCE TO RELATED APPLICATIONS/INCORPORATION BY REFERENCE

This application makes reference to, claims priority to, and claims the benefit of U.S. Provisional Application Ser. No. 60/577,814 filed Jun. 8, 2004.

FIELD OF THE INVENTION

Certain embodiments of the invention relate to buffer circuits. More specifically, certain embodiments of the invention relate to a method and system for low cost line buffer system design.

BACKGROUND OF THE INVENTION

In some conventional methods of line buffer system design, a plurality of line buffers may be used to store incoming horizontal lines of data which may have been scanned from a horizontal line in an image. At any point in time, data may be written to a single line buffer while being read from all of the line buffers. A fixed sequence may be utilized to determine to which line buffer incoming data is to be written from among the plurality of line buffers. When writing to a line buffer data from among a plurality of line buffers, an entire incoming horizontal line of data may be written to the line buffer. Then a second line buffer from among the plurality of line buffers may be selected and data from a second incoming horizontal line of data will be written to the second line buffer. This, in turn, may be followed with the selection of a third line buffer to which data from a third incoming horizontal line of data may be written. Subsequent incoming horizontal lines of data may be written in a similar manner.

FIG. 1A is a block diagram of a conventional line buffer system design. Referring to FIG. 1A, there is shown write control logic 10, line buffers 12, 14, and 16, read address logic 18, data rotation logic 20, write enable signals 22, 24, and 26, write data signal 28, write address signal 30, read address signal 32, read data signals 34, 36, and 38, and line output signals 40, 42, and 44.

The read address logic 18 may be adapted to generate read addresses to the plurality of line buffers. Circuitry which implements the read address logic may generate addresses independently from the circuitry which generates write addresses to the plurality of line buffers.

The write control logic 10 may be adapted to control the selection of which line buffer is to be written, from among the plurality of line buffers 12, 14, and 16. An embodiment of circuitry for write control logic 10 may comprise generation of the plurality of write enable signals 22, 24, and 26, in which a separate such signal may be generated for each of a plurality of line buffers. In FIG. 1A the write enable signal 22 is coupled to the line buffer 12, the write enable signal 24 is coupled to the line buffer 14, and the write enable signal 26 is coupled to the line buffer 16.

The line buffers 12, 14, and 16 may be adapted to store data received from an input write data signal 28 which is presented to the write data (write_data) input of the line buffer. The location to which the write data input is stored in the line buffer may be determined by the write address signal 30, which is presented to the write address (write_addr) input to the line buffer. The write enable signals 22, 24, and 26 from the write control logic 10, which are presented to the write enable (wen) inputs to the line buffers 12, 14, and 16, may enable data presented to the write data (write_data) input to be stored in the line buffer at a location according to the write address signal 30 which is presented to the write address (write_addr) input of the line buffers. The line buffers 12, 14, and 16 may also be adapted to output read data signals 34, 36, and 38 which are presented from the read data (read_data) output of the line buffers. The read data signals presented at the read data (read_data) outputs from the line buffers may represent the data which is stored at a location as specified by the read address signal 32, which is presented to the read address (read_addr) inputs to the line buffers.

The data rotation logic 20 may comprise suitable logic, circuitry, and/or code that may be adapted to take as input, the plurality of read data signals 34, 36, and 38, and rearrange their order in the plurality of line output signals 40, 42, and 44.

In operation, the write control logic 10 may utilize a write enable signal, to send a signal which enables incoming horizontal data to be written to the line buffer which is coupled to that write enable signal. Concurrently, the other write enable signals, from among the plurality of write enable signals, may be utilized to send a signal which disables incoming horizontal data to be written to each of a plurality of line buffers which is coupled to one of the write enable signals. For example, the sending of an enable signal on the write enable signal 22, may enable the writing of incoming horizontal data which is contained in the write data signal 28, to the line buffer 12. The simultaneous sending of a disable signal on the write enable signals 24 and 26, may disable the writing of incoming horizontal data which is contained in the write data signal 28 to the line buffers 14 and 16.

The conventional method of line buffer design may entail reorganization of data from the plurality of line buffers such that the most recently received horizontal line of data appears on a specific output signal, while a second most recently received horizontal line of data appears on another specific output signal, and so forth. This rearrangement of the order of output signals from the line buffers may be necessary to meet the requirements for the presentation of horizontal lines of data to subsystems which follow the line buffer system.

The output from the plurality of line buffers may comprise a plurality of input lines to a proceeding subsystem. A subsystem following the line buffer system may require that the most recently received horizontal line of data always appear on a specific output line, the next most recently received horizontal line of data always appear on another specific output line, and so forth, for each of the plurality of output lines which are going to a proceeding subsystem. Unfortunately, the actual writing of data to line buffers may be such that the most recently received horizontal line may be stored at a different line buffer with each incoming horizontal line of data. For example with reference to FIG. 1A, at a particular time instant, the line buffer 16 may store the most recently received horizontal line of data, the line buffer 14 may store the previously received line of horizontal data, and the line buffer 12 may store the line of horizontal data which arrived prior to the line of horizontal data stored in the line buffer 14.

After the line buffer 16 has completed receipt of the most recently received horizontal line of data, the write control logic may enable the line buffer 12 to receive the next incoming line of horizontal data. At a subsequent time instant, that next incoming line of horizontal data may have been stored at the line buffer 12. This may indicate that the line buffer 12 now stores the most recently received horizontal line of data, the line buffer 16 may store the previously received line of horizontal data, while the line buffer 14 may store the horizontal line of data which arrived prior to the horizontal line of data stored at line buffer 16.

The data rotation logic 20 may be adapted to receive, as an input, the output being read from each of the plurality of line buffers. Circuitry implementing the data rotation logic may then determine which of the line buffers contains the most recently received horizontal line of data, based upon the known fixed sequence in which line buffers are written. That data may them be transferred to a specific line output signal 40, 42, or 44 from the data rotation logic 20, which may be designated to always present the most recently received horizontal line of data to a proceeding subsystem. Similarly, the data rotation logic circuitry may also identify which line buffer contains the second most recently received horizontal line of data, and so forth.

For example, referring to FIG. 1A, the output signal 40 from data rotation logic 20, may be designated as the output which is to present the most recently received horizontal line of data, designated as line=K, where K represents an order in which the line arrived relative to other incoming lines of horizontal data. Furthermore, the output signal 42 may be designated to present the previously received horizontal line of data, designated as line=K−1, while the output signal 44 may be designated to present a horizontal line of data received prior to the horizontal line of data presented at the output 42, designated as line=K−2. When line buffer 12 stores the most recently received line of data, the output signal 34 may be coupled to the output signal 40 by the data rotation logic 20. When the line buffer 12 stores the previously received horizontal line of data, the output signal 34 may be coupled to output signal 42. When the line buffer 12 stores the line received prior to the previously received horizontal line of data, the output signal 34 may be coupled to the output signal 44.

When the line buffer 14 stores the most recently received line of data, the output signal 36 may be coupled to the output signal 40 by the data rotation logic 20. When the line buffer 14 stores the previously received horizontal line of data, output signal 36 may be coupled to the output signal 42. When the line buffer 14 stores the line that was received prior to the previously received horizontal line of data, the output signal 36 may be coupled to the output signal 44. When the line buffer 16 stores the most recently received line of data, the output signal 38 may be coupled to the output signal 40 by the data rotation logic 20. When line buffer 16 stores the previously received horizontal line of data, the output signal 38 may be coupled to the output signal 42. When the line buffer 16 stores the line that was received prior to the previously received horizontal line of data, the output signal 38 may be coupled to the output signal 44.

Some applications may discard bits which are contained in the data in some horizontal lines of data. However since, at some time, each line buffer may store a line from each ordinal position, most recently received line, second most recently received line, and so forth, from among the plurality of lines which may be stored simultaneously in the line buffer system design, all line buffers among the plurality of line buffers may be required to be of the same width.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention provide a method and system for low cost buffer design. Aspects of the method may comprise inputting a write address signal to a plurality of line buffers, wherein a read data output of a previous line buffer in the plurality of line buffers is coupled to a write data input of a subsequent line buffer in the plurality of line buffers. The method may further comprise writing an input write data signal to a first of the line buffers, and transferring data from at least the first of the line buffers to at least the subsequent line buffer based on an input write address signal coupled to the plurality of line buffers and/or a single write enable signal coupled to the same plurality of line buffers. A width of a subsequent plurality of line buffers may be adapted to be less than or equal to a width of the preceding line buffers. An input write data signal may be coupled to the first line buffer among a plurality of line buffers.

An increment may be added to a write address signal in order to generate a read address signal to the plurality of line buffers. Furthermore, an increment of a determined amount may be added to the write address signal in order to generate the read address signal at a time t=N, where N is a particular instant in time. A read address signal may be input to each of the plurality of line buffers. A read data signal may be output from a location according to a read address signal at each of a plurality of line buffers. Write data may be written to a location according to the write address signal at each of a plurality of line buffers.

Another embodiment of the invention may provide a method which comprises adding an increment to a received write address signal, which is coupled to a plurality of line buffers, wherein a read data output of a previous line buffer is coupled to a write data input of a subsequent buffer without requiring write control logic, read control logic, and/or data rotation logic. In relation to this aspect of the invention, an input write data signal may be input to the first line buffer. A width of a subsequent plurality of line buffers may be less than or equal to a width of the preceding ones of the plurality of line buffers.

Aspects of a system for a low cost buffer may comprise circuitry that inputs a write address to a plurality of line buffers, wherein a read data output of a previous line buffer is coupled to a write data input of a subsequent line buffer. The circuitry may further write input data to a first of the line buffers, and transfer data from at least the first line buffer to at least the subsequent line buffer based on an input write address coupled to the line buffers and/or a single write enable coupled to the line buffers. The width of a subsequent plurality of line buffers may be less than or equal to the width of the preceding ones of the plurality of line buffers. An input write data signal may be coupled to the first line buffer among a plurality of line buffers.

The system may comprise circuitry, which may be adapted to increment a write address in order to generate a read address to the line buffers. Furthermore, the write address may be incremented by a determined amount in order to generate the read address at a time t=N, where N is a particular instant in time. A read address may be input to each of the plurality of line buffers. Read data may be output from a location according to a read address at each of a plurality of line buffers. Write data may be written to a location according to a write address at each of the line buffers.

The circuitry may further be adapted to increment a received write address, which may be coupled to the line buffers, wherein a read output of a previous line buffer is coupled to a write data input of a subsequent line buffer without requiring write control logic, read control logic, and/or rotation logic. In accordance with an aspect of the invention, an input write data signal may be input to the first line buffer. A width of a subsequent plurality of line buffers may be adapted to be less than or equal to a width of the preceding line buffers.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention provide a method and a system for low cost line buffer design. Various aspects of the method may be utilized in a manner which may allow a reduction in circuitry versus conventional approaches to line buffer design. This reduction in circuitry may make it more efficient for implementation on an integrated circuit chip where die size and power consumption are very important design considerations.

An embodiment of the invention may comprise a plurality of line buffers in which an output of one line buffer in the plurality of line buffers may be coupled to an input of a succeeding line buffer in the plurality of line buffers. A first line buffer in the plurality of line buffers may be coupled to an input write data signal, while the width of a subsequent plurality of line buffers may be less than or equal to the width of the previous line buffers in the plurality of line buffers. Write address and write enable signals are provided which are adapted to facilitate the writing of data to a line buffer. A received write address signal may be coupled to each of a plurality of line buffers which may be adapted to determine the location at which data will be written at each of the plurality of line buffers. The write enable signal may enable the actual writing of data to the location determined by the write address signal. The received write address signal may be incremented, by a determined amount at time t=N, where N is a particular instant in time, in order to generate a read address signal. The generated read address signal may be coupled to each of a plurality of line buffers and that read address signal may determine the location from which output is read at each of the plurality of line buffers.

Figure 1A:
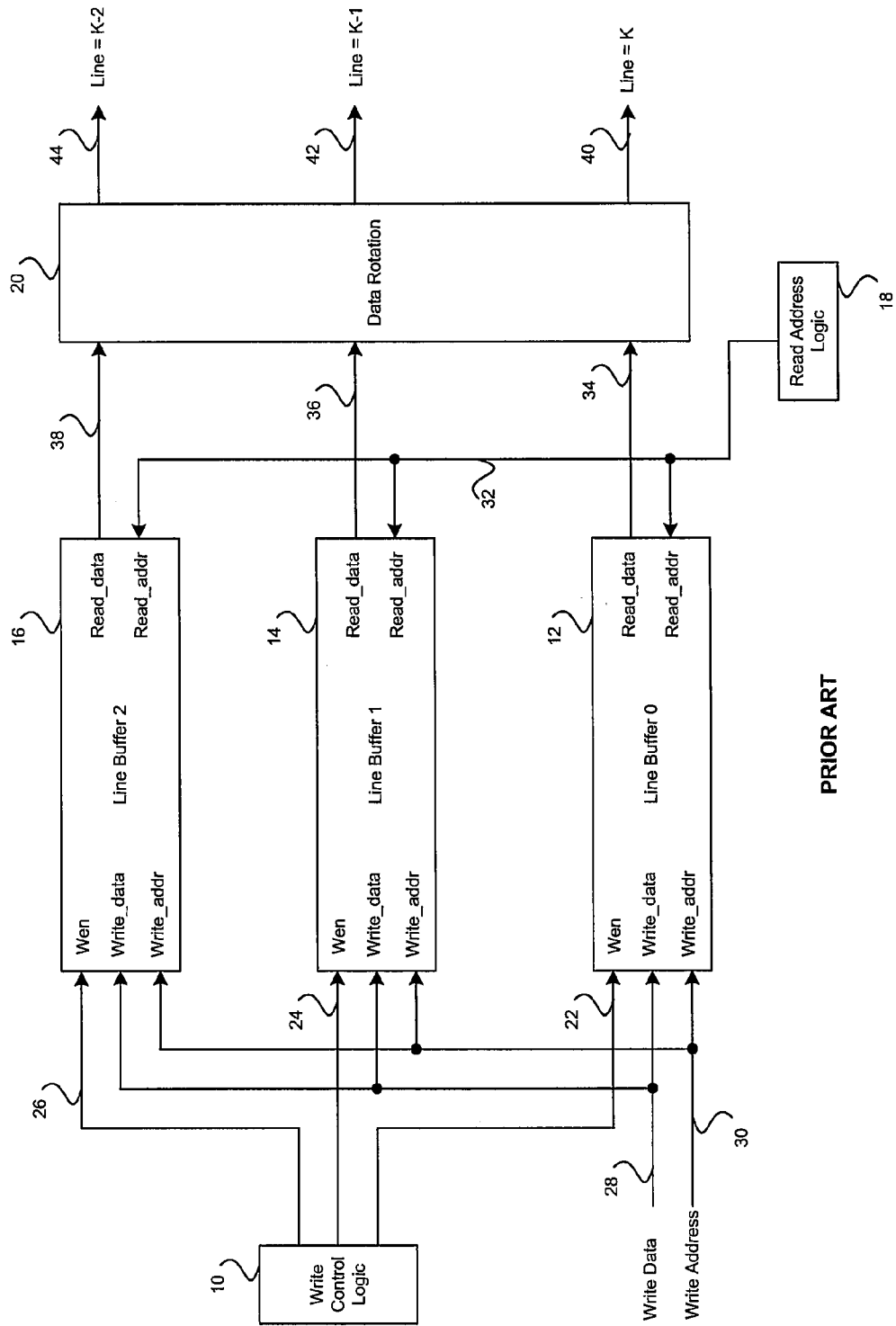
FIG. 1A is a block diagram of a conventional line buffer system design.
Figure 1B:
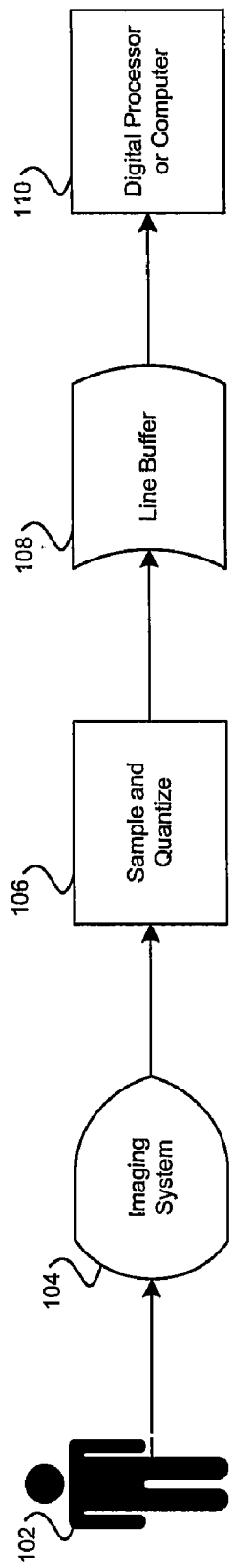
FIG. 1B shows a block diagram of an exemplary system for digital image processing.

FIG. 1B shows a block diagram of an exemplary system for digital image processing which may be utilized in connection with an embodiment of the invention. Referring to FIG. 1B, there is shown a subject 102, an imaging system 104, a sample and quantize block 106, a line buffer 108, and a digital processor or computer 110.

An image of a subject 102, may be captured by the imaging system 104 which may represent the image as a two-dimensional array of discrete picture elements (or pixels). A digital representation of the image may be created by the sample and quantize block 106 which may be adapted to represent each pixel as a digital word comprised of a plurality of bits. The digital representation of each pixel may comprise a single field, which may represent luminance (Y) information, for a monochrome representation of an image. Alternatively, a digital representation of a pixel may comprise two fields, which may represent Y and chroma (C) information, for a composite color representation of an image. Or, a digital representation of a pixel may comprise three fields, which may represent Y, color difference red (Cr) and color difference blue (Cb) information, for a component color representation of an image.

The specific digital representation used by the sample and quantize block 106 may define the width of the data path to the line buffer 108. The line buffer 108 may provide temporary storage for digital representations of the pixels, which are contained in an image. In addition, the sample and quantize block 106 may scan pixels in the image captured by the imaging system 104 as a plurality of pixels which may be contained in a horizontal line in the image. The line buffer 108 may store a plurality of pixels, which correspond to one or more horizontal lines in the image.

Image processing, or image transformation, may be performed by a digital processor or computer 110, which may retrieve pixels from the line buffer 108, as required, to perform the image processing task on the digital representation of the image. The image processing task performed by the digital processor or computer 110 may comprise performing computations involving a two-dimensional sub-array of pixels which are contained in a contiguous block of I horizontal pixels within a line, and J vertical pixels from a plurality of lines in a digital representation of an image. In image processing applications, an I×J sub-array of pixels may be called a convolution mask, or kernel. When performing image processing tasks involving a color representation of an image, color information contained in some pixels may be discarded.

Figure 1C:
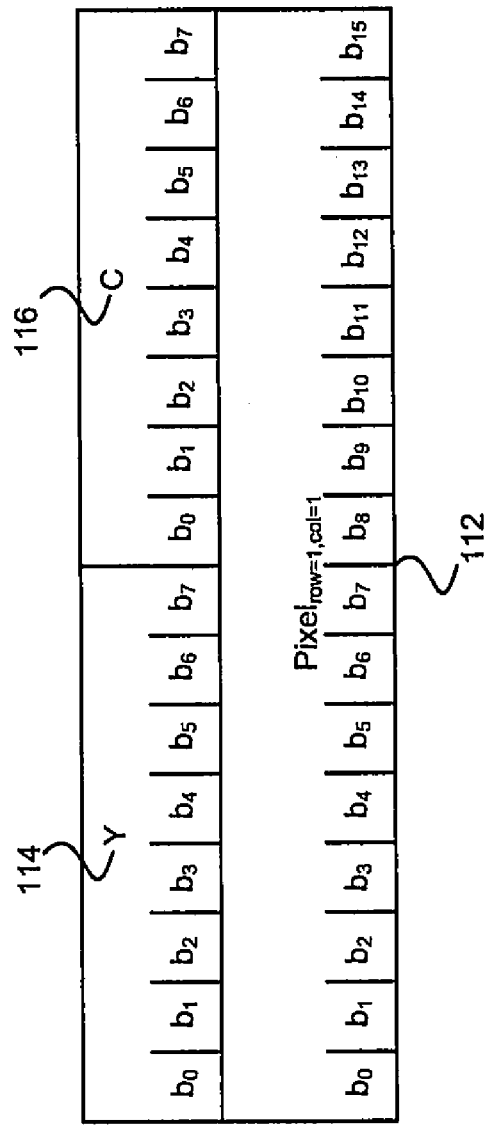
FIG. 1C shows a block diagram of a digital rending of a pixel utilizing a composite color representation.

FIG. 1C shows a block diagram of a digital representation of a pixel utilizing a composite color representation of an image. Referring to FIG. 1C there is shown a pixel 112, a Y field 114, and a C field 116.

In FIG. 1C, the Y field 114 may be comprised of 8 bits, the C field may be comprised of 8 bits, and the pixel 112 may be comprised of 16 bits. The number of bits in the pixel 112 may, in turn, be defined by the number of bits that are contained in the Y field 114, and the number of bits that are contained in the C field 116. The pixel 112 may represent a pixel position in the top, left corner (line 1, column 1) in the pixel array in a digital representation of an image. The width of the data path which may carry the pixel 112 may be defined by the number of bits which are contained in the pixel 112.

Figure 2:
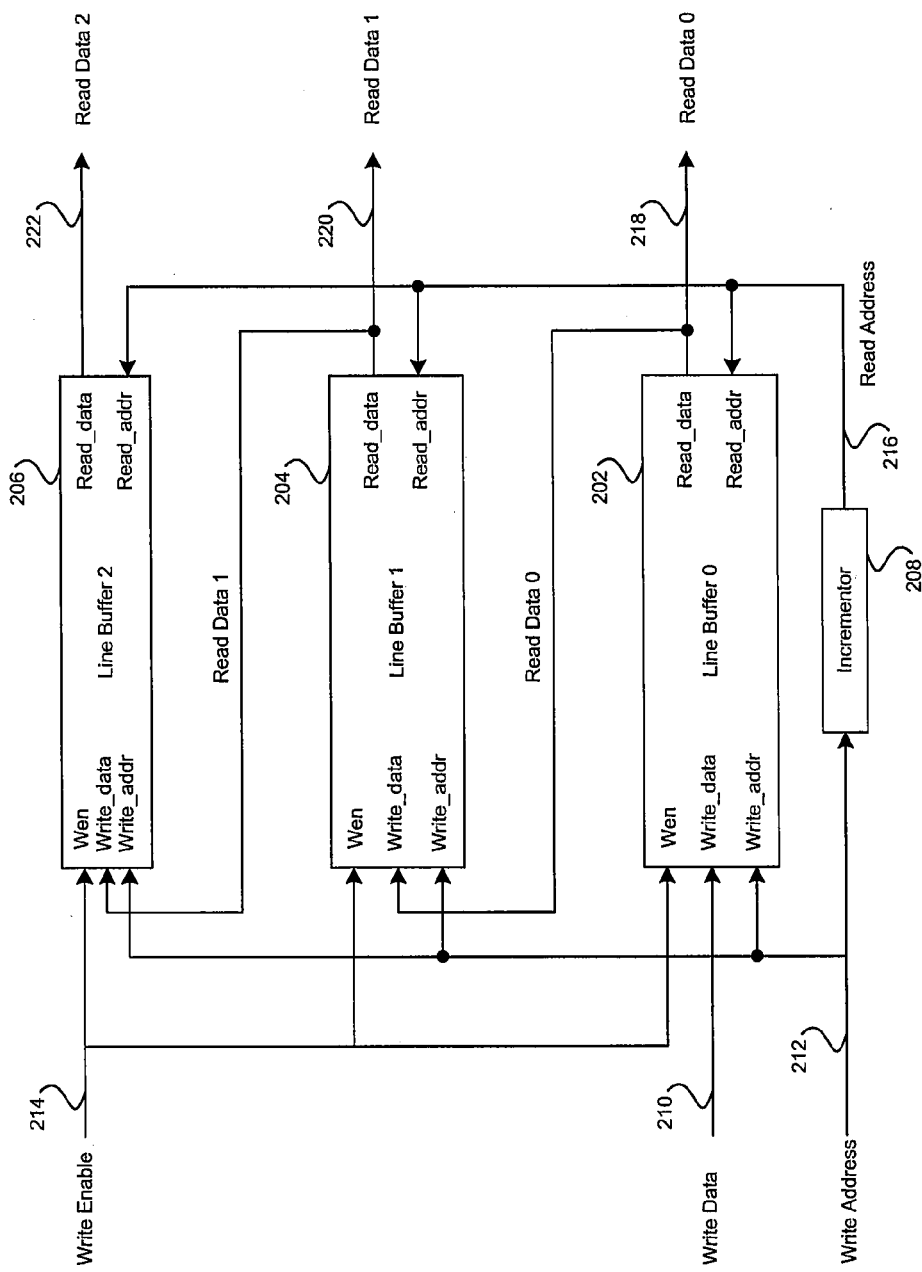
FIG. 2 is a block diagram of an exemplary system for low cost line buffer design in accordance with an embodiment of the invention.

FIG. 2 is a block diagram of an exemplary system for low cost line buffer design in accordance with an embodiment of the invention. Referring to FIG. 2, there is shown a plurality of line buffers 202, 204, 206, an incrementor 208, an input write data signal 210, an input write address signal 212, an input write enable signal 214, a read address signal 216, an output read data 0 signal 218, an output read data 1 signal 220, and an output read data 2 signal 222.

The exemplary system for low cost line buffer design may comprise a plurality of line buffers. For example, line buffer 0, 202, may be the first of the plurality of line buffers, line buffer 1, 204 may be the second line buffer among the plurality of line buffers, and line buffer 2, 206, may be the last of the plurality of line buffers.

Line buffer 0, 202, may receive the input write data signal 210 at its write data (write_data) input. The line buffer 202 may generate the output read data 0 signal, 218. The input read address signal 216 may determine the location within the line buffer 202 from which data is to be read. This data may be contained in the output read data 0 signal, 218. The output read data 0 signal 218 from line buffer 202 may be coupled to the write data (write_data) input at line buffer 1, 204. The input write address signal 212 may determine the location within the line buffer 202, to which data, contained in the input write data signal 210, is to be written. The input write enable signal 214 may enable data contained in the input write signal 210 to be written to the location according to the input write address signal 212.

Line buffer 1, 204, may receive the output read data 0 signal 218 at its write data (write_data) input. The line buffer 204 may generate the output read data 1 signal, 220. The input read address signal 216 may determine the location within the line buffer 204 from which data is to be read. This data may be contained in the output read data 1 signal, 220. The output read data 1 signal 220 from line buffer 204 may be coupled to the write data (write_data) input at line buffer 2, 206. The input write address signal 212 may determine the location within the line buffer 204, to which data, contained in the input read data 0 signal 218, is to be written. The input write enable signal 214 may enable data contained in the input read data 0 signal 218 to be written to the location according to the input write address signal 212.

Line buffer 2, 206, may receive the output read data 1 signal 220 at its write data (write_data) input. The line buffer 206 may generate the output read data 2 signal, 222. The input read address signal 216 may determine the location within the line buffer 206 from which data is to be read. This data may be contained in the output read data 2 signal, 222. The input write address signal 212 may determine the location within the line buffer 206, to which data contained in an input read data 1 signal 220 is to be written. The input write enable signal 214 may enable data, contained in the input read data 1 signal 220, to be written to the location according to the input write address signal 212.

The incrementor 208 may be adapted to receive the input write address signal 212 as an input and generate a read address signal 216 as an output. The write address signal 212 which may be an input to the incrementor 208 may be the same write address signal 212 which is produced as an input to each of the plurality of line buffers 202, 204, and 206. The read address signal 216 which may be an output from the incrementor 208 may be the same as the read address signals input to each of the line buffers 202, 204, and 206.

In an embodiment of the invention which captures the prospect that in some applications some fields may not be utilized in some pixels, the data path of line buffer 206 may not be as wide as the data paths of each of preceding line buffers, line buffer 202, and 204. Thus, some bits from the read data 1 signal 220 which are output from line buffer 204 may be discarded at the write data (write_data) input of line buffer 206.

Figure 3:
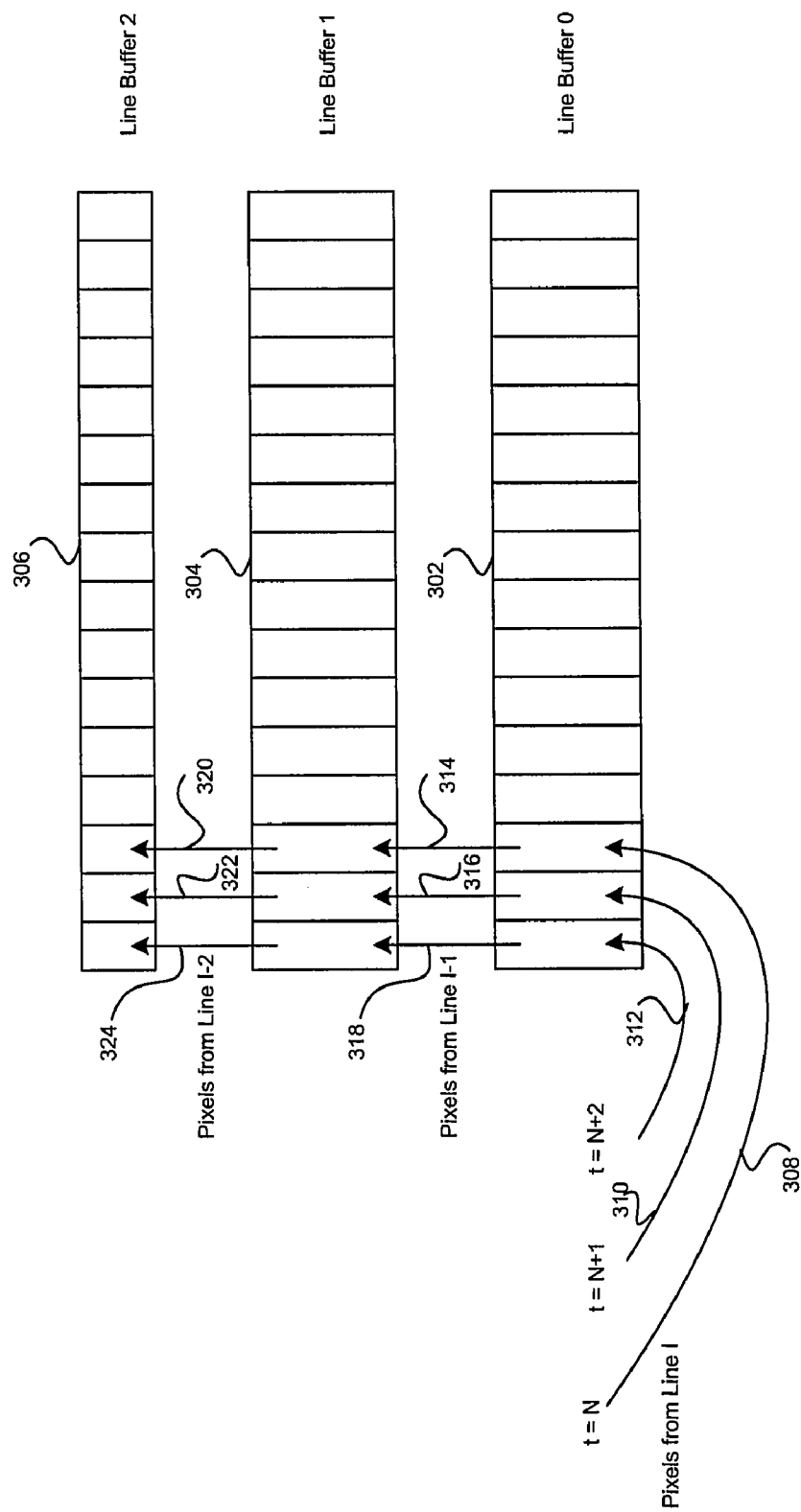
FIG. 3 is a diagram illustrating operation of the low cost buffer system of FIG. 2, for example, in accordance with an embodiment of the invention.

FIG. 3 is a diagram illustrating operation of the low cost buffer system of FIG. 2, for example, in accordance with an embodiment of the invention. Referring to FIG. 3, there is shown line buffers 302, 304, and 306, the values of pixels from line I at time t=N, 308, at t=N+1, 310, and t=N+2, 312. Also shown are the values of pixels from line I−1 at time=N, 314, at t=N+1, 316, and t=N+2, 318, and the values of pixels from line I−2 at time=N, 320, at t=N+1, 322, and t=N+2, 324.

The values of pixels 308, 310, and 312 which are contained in a current line, denoted as line I, may arrive at line buffer 302 at instants in time t=N, t=N+1, and t=N+2 respectively. Data from pixels 314, 316, and 318 which are contained in a preceding line, denoted as line I−1, in image data which had arrived at line buffer 302 a time preceding t=N, and had previously been written to line buffer 302, may be output from line buffer 302 and written to line buffer 304. Pixels 314, 316, and 318 are written to line buffer 304 at instants in time t=N, t=N+1, and t=N+2 respectively. Further, pixels 320, 322, and 324 which may be contained in a line preceding line I−1, denoted as line I−2, in an image which had previously been written to line buffer 304, may be output from line buffer 304 and written to line buffer 306. Pixels 320, 322, and 324 are written to line buffer 306 at instants in time t=N, t=N+1, and t=N+2, respectively.

Figure 4:
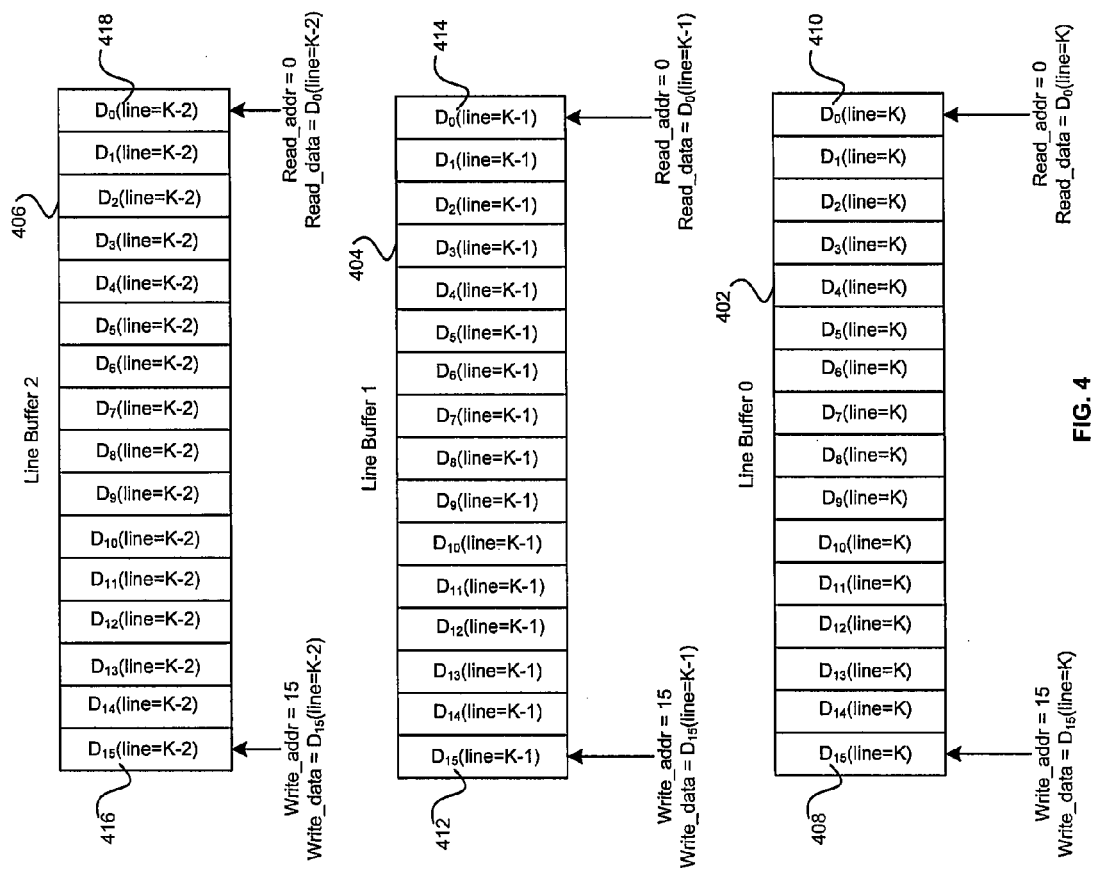
FIG. 4 is a diagram illustrating detailed operation of the low cost line buffer design of FIG. 2, for example, in accordance with an embodiment of the invention.

FIG. 4 is a diagram illustrating detailed operation of the low cost line buffer design of FIG. 2, for example, in accordance with an embodiment of the invention. Referring to FIG. 4, there is shown line buffers 402, 404, and 406, and pixel data $D_{15}$(line=K), 408, $D_0$(line=K), 410, $D_{15}$(line=K−1), 412, $D_0$(line=K−1), 414, $D_{15}$(line=K−2), 416, and $D_0$(line=K−2), 418.

The line buffer 402, the line buffer 404, and the line buffer 406, may each store pixels from a line of a digital representation of an image, where each line may contain 16 pixels. The width of line buffer 402 may be 16 bits, the width of line buffer 404 may be 16 bits, and the width of line buffer 406 may be 8 bits. The incrementor, shown as 208 in FIG. 2, may be adapted to increment the write address value to generate a read address.

At time instant t=N, the 16$^{th}$ and last pixel in the current line of an image has just arrived at the write data (write_data) (write data, 210 FIG. 2) input to the line buffer 402. This pixel may be denoted as $D_{15}$(line=K). The write address at time t=N may have a value of 15, which may result in $D_{15}$(line=K) being written to location 15, 408, at the line buffer 402. The corresponding read address at time t=N may have a value of 0, which may result in $D_0$(line=K) being read from location 0, 410, at the line buffer 402. The $D_0$(line=K) value may be presented at the read data 0 (read_data) output from line buffer 402 at a instant in time which occurs shortly after time t=N. For example, in order to avoid race conditions in a system design, write data may be written to the line buffers on the rising edge of a system clock while read data may be latched into outputs on the falling edge of a system clock. $D_0$(line=K) may refer to the first pixel in line=K of digital image data.

At time instant t=N, the current value of the read data (read_data) (read data 0, 218 FIG. 2) output from the line buffer 402 may be the 16$^{th}$ and last pixel in the previous line, line=K−1. The read data (read_data) (read data 0, 218) output from the line buffer 402 has just arrived at the write data (write_data) (read data 0, 218) input to the line buffer 404. This pixel may be denoted as $D_{15}$(line=K−1). The write address at time t=N may have a value of 15, which may result in $D_{15}$(line=K−1) being written to location 15, 412, at line buffer 404. The corresponding read address at time t=N may have a value of 0, which may result in $D_0$(line=K−1) being read from location 0, 414, at the line buffer 404. The $D_0$(line=K−1) value may be presented at the read data 1 (read_data) output from line buffer 404 at an instant in time which occurs shortly after time t=N. $D_0$(line=K−1) may refer to the first pixel in line=K−1 in a digital representation of an image.

At time instant t=N, the current value of the read data (read_data) (read data 0, 220) output from the line buffer 404 may be the 16$^{th}$ and last pixel in the line of an image which arrived 2 lines previous to the current line, line=K−2. The read data (read_data) (read data 0, 220) output from the line buffer 404 may have just arrived at the write data (write_data) (read data 0, 220) input to the line buffer 406. This pixel may be denoted as $D_{15}$(line=K−2). The write address at time t=N may have a value of 15, which may result in $D_{15}$(line=K−2) being written to location 15, 416, at the line buffer 406. Since the width of the line buffer 406 may be less than the width of line buffer 404, some of the bits which are contained in $D_{15}$(line=K−2) may have been discarded. The corresponding read address at time t=N may have a value of 0, which may result in $D_0$(line=K−2) being read from location 0, 418, at the line buffer 406. The $D_0$(line=K−2) value may be presented at the read data 0 (read_data) output from line buffer 406 at a instant in time which occurs shortly after time t=N. $D_0$(line=K−2) may refer to the first pixel in line=K−2 in a digital representation of an image.

Figure 5:
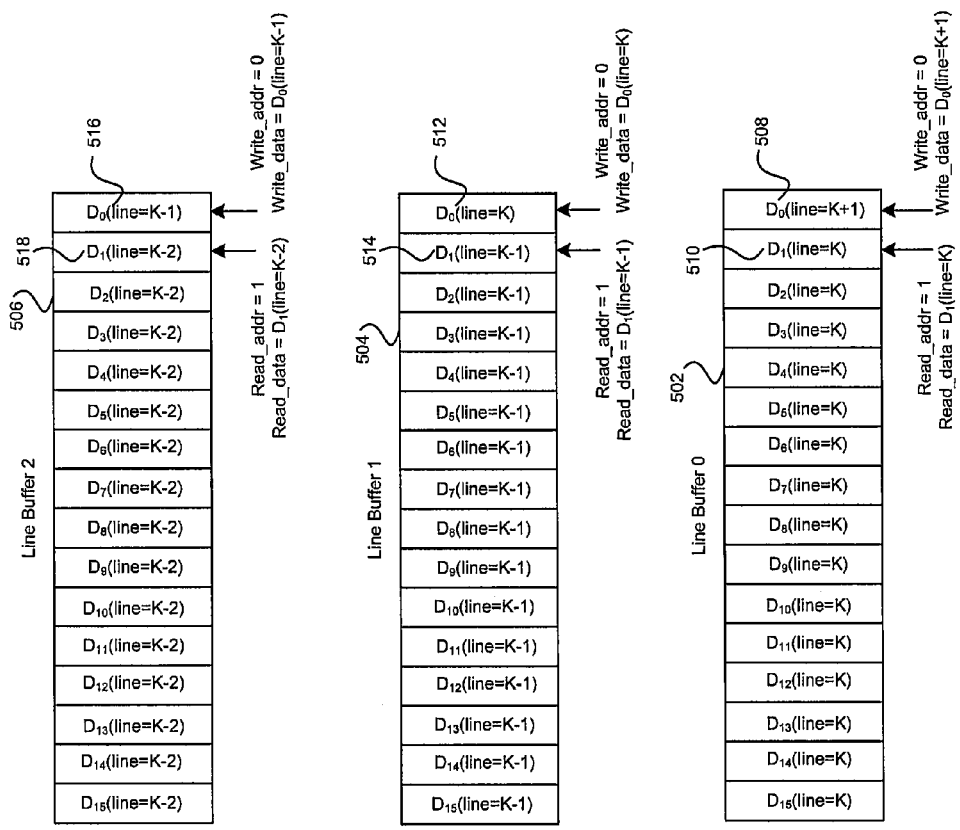
FIG. 5 is a diagram illustrating detailed operation of the low cost line buffer design of FIG. 2, for example, at a time subsequent to that illustrated in FIG. 4 in accordance with an embodiment of the invention.

FIG. 5 is a diagram illustrating detailed operation of the low cost line buffer design of FIG. 2, for example, at time t=N+1 of a time subsequent to that illustrated in FIG. 4 in accordance with an embodiment of the invention. Referring to FIG. 5, there is shown line buffers 502, 504, and 506, and pixel data $D_0$(line=K+1), 508, $D_1$(line=K), 510, $D_0$(line=K), 512, $D_1$(line=K−1), 514, $D_0$(line=K−1), 516, and $D_1$(line=K−2), 518.

The line buffer 502, the line buffer 504, and the line buffer 506, may each store pixels from a line of a digital representation of an image, where each line may contain 16 pixels. A width of the line buffer 502 may be 16 bits, a width of the line buffer 504 may be 16 bits, and a width of the line buffer 506 may be 8 bits. The incrementor, shown as 208 in FIG. 2, may be adapted to increment the write address to generate a read address.

At time instant t=N+1, the first pixel in the current line of an image has just arrived at the write data (write_data) (write data, 210) input to the line buffer 502. This pixel may be denoted as $D_0$(line=K+1). The write address at time t=N may have a value of 15, which may result in $D_0$(line=K+1) being written to location 15, 508, at the line buffer 502. The corresponding read address at time t=N+1 may have a value of 1, which may result in $D_1$(line=K) being read from location 0, 510, at the line buffer 502. The $D_1$(line=K) value may be presented at the read data 0 (read_data) output from line buffer 402 at a instant in time which occurs shortly after time t=N. $D_1$(line=K) may refer to the first pixel in line=K in a digital representation of an image.

At time t=N, the first pixel from the previous line of an image, $D_0$(line=K), may have been read from the line buffer 502. At time t=N+1, $D_0$(line=K) may have been transferred to the read data (read_data) (read data 0, 218 FIG. 2) output of line buffer 502. Also at time t=N+1, the read data (read_data) (read data 0, 218) output from the line buffer 502 may have just arrived at the write data (write_data) (read data 0, 218) input to the line buffer 504. Thus, at time t=N+1, the pixel value denoted as $D_0$(line=K), which had previously been read from the line buffer 502 at time t=N, may be presented in the write data (write_data) (read data 0, 218) input to the line buffer 504. The write address at time t=N+1 may have a value of 0, which may result in $D_0$(line=K) being written to location 0, 512, at the line buffer 504. The corresponding read address at time t=N+1 may have a value of 1, which may result in $D_1$(line=K−1) being read from location 1, 514, at the line buffer 504. The $D_1$(line=K−1) value may be presented at the read data 1 (read_data) output from line buffer 504 at a instant in time which occurs shortly after time t=N+1. $D_1$(line=K−1) may refer to the second pixel in line=K−1 in a digital representation of an image.

At time t=N, the first pixel from the line which is 2 lines previous to the current line of an image, $D_0$(line=K−1), may have been read from the line buffer 504. At time t=N+1, $D_0$(line=K−1) may have been transferred to the read data (read_data) (read data 1, 220) output of the line buffer 504. Also at time t=N+1, the read data (read_data) (read data 1, 220) output from the line buffer 504 may have just arrived at the write data (write_data) (read data 1, 220) input to the line buffer 506. Thus, at time t=N+1, the pixel value denoted as $D_0$(line=K−1), which had previously been read from the line buffer 504 at time t=N, may be presented in the write data (write_data) input to line buffer 506. The write address at time t=N+1 may have a value of 0, which may result in $D_0$(line=K−1) being written to location 0, 514, at line buffer 506. Since the width of the line buffer 506 may be less than the width of the line buffer 504, some of the bits which are contained in $D_0$(line=K−1) may have been discarded. The corresponding read address at time t=N+1 may have a value of 1, which may result in $D_1$(line=K−2) being read from location 1, 516, at the line buffer 506. The $D_1$(line=K−2) value may be presented at the read data 2 (read_data) output from line buffer 506 at a instant in time which occurs shortly after time t=N+1. $D_1$(line=K−1) may refer to the second pixel in line=K−1 in a digital representation of an image.

In operation, it may be necessary to initially fill the line buffers with data prior to reading valid data. In an embodiment of the invention, and with reference to FIG. 2, each of the plurality of line buffers 202, 204, and 206, may have a length, L, and each opportunity to write to the line buffers may be considered to be a distinct instant in time. Thus, from time=1 to time=L, valid data may be written to line buffer 0 202, but all read data may be ignored. From time=L+1 to time=2L, valid data may be written to line buffer 0 202, and line buffer 1 204, and valid data may be read from line buffer 0 202 only. From time=2L+1 to time=3L, valid data may be written to line buffer 0 202, line buffer 1 204, and line buffer 2 206, and valid data may be read from line buffer 0 202, and line buffer 1 204 only. From time=3L+1 to 4L, valid data may be written to line buffer 0 202, line buffer 1 204, and line buffer 2 204, and valid data may be read from line buffer 0 202, line buffer 1 204, and line buffer 2 206. From time=4L+1 valid data may be written and read from line buffer 0 202, line buffer 1 204, and line buffer 2 206.

Figure 6:
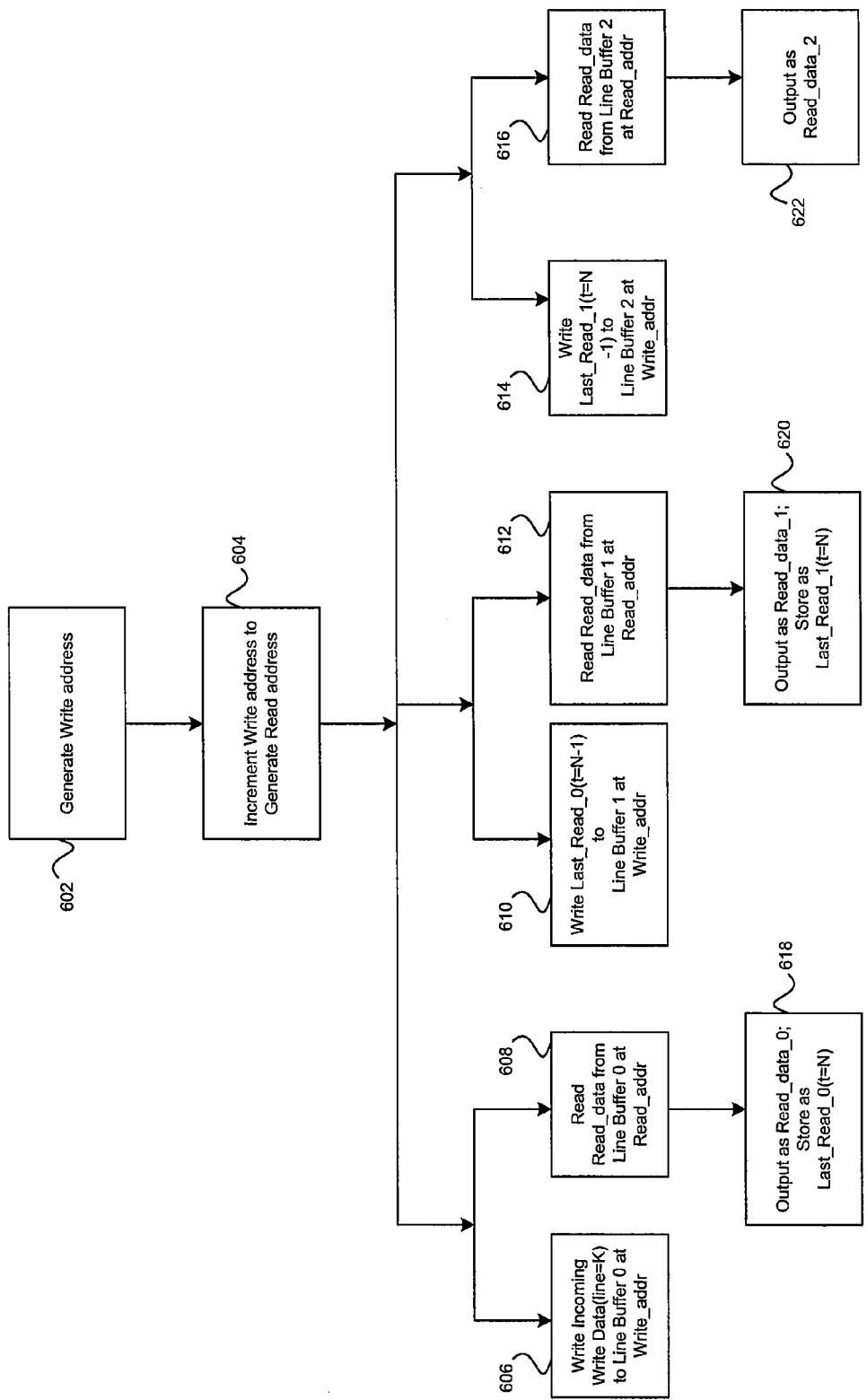
FIG. 6 is a flowchart illustrating exemplary steps in the operation of an exemplary system in accordance with an embodiment of the invention.

FIG. 6 is a flowchart illustrating exemplary steps in the operation of an exemplary system in accordance with an embodiment of the invention. In step 602, the write address may be generated which may be input to the write address (write_addr) (write address, 212 FIG. 2) inputs of each of a plurality of line buffers. In step 604, the write address may be incremented to generate a read address, which may be input to the read address (read_addr) (read address, 216 FIG. 2) inputs of each of a plurality of line buffers. Steps 606, 608, 610, 612, 614, and 616 may be steps that are performed concurrently at an instant in time, t=N. In step 606, an incoming write data (write data, 210) may be written to the line buffer 0 at a location according to write address (write_addr) (write address, 212). In step 608, read data (read_data) (read data 0, 218 FIG. 2) may be read from the line buffer 0 at a location according to read address (read_addr) (read address, 216).

Following step 608, step 618 outputs read data (read_data) (read data 0, 218) from the line buffer 0 as read_data_0. In step 618 the value of a last read variable (last_read_0(t=N)) may be set to the value contained in the read data output (read_data) (read data 0, 218) from the line buffer 0.

In step 610 writes the value of a last read variable (last_read_0(t=N−1)) to the line buffer 1 at a location according to the write address (write_addr) (write address, 212). In step 612 read data (read data) (read data 1, 220 FIG. 2) may be read from the line buffer 1 at a location according to read address (read_addr) (read address, 216). Following step 612, step 620 outputs read data (read_data) (read data 1, 220) from the line buffer 1 as read data (read_data_1). In step 620 value of a last read variable (last_read_1(t=N)) may be set to the value contained in the read data output (read_data) (read data 1, 220) from line buffer 1.

In step 610 the value of a last read variable (last_read_0 (t=N−1)), represents the value of the last read from the line buffer 0 which was previously generated at time t=N−1.

In step 614, the value of a last read variable (last_read_1 (t=N−1)) may be written to the line buffer 2 at a location according to write address (write_addr) (write address 212). In step 616, read data (read_data) (read data 2, 222 FIG. 2) may be read from the line buffer 2 at a location according to read address (read_addr) (read address, 216). Following step 616, step 622 outputs read data (read_data) (read data 2, 222) from the line buffer 2 as read data (read_data_2).

In step 614 a last read variable (last_read_1(t=N−1)), represents the value of the last read from the line buffer 1 which was previously generated at time t=N−1.

Embodiments of the invention may be utilized in a manner which may allow a reduction in circuitry versus conventional approaches to line buffer design. This reduction in circuitry may make it more efficient for implementation on an integrated circuit chip where die size and power consumption are very important design considerations.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for low cost line buffer design, the method comprising: concurrently transferring data from each of at least a portion of a plurality of line buffers to at least a subsequent one of said plurality of line buffers based on a single write address and a single write enable signal; wherein said at least a subsequent one of said plurality of line buffers receives said concurrently transferred data comprising at least a portion of read data output from a corresponding one of said each of at least a portion of said plurality of line buffers; wherein a width of at least one subsequent one of said plurality of line buffers is less than a width of any preceding one of said plurality of line buffers.

2. The method according to claim 1, comprising receiving input data written to a first of said plurality of line buffers from a data source external to said plurality of line buffers.

3. The method according to claim 1, comprising incrementing said single write address to generate a single read address.

4. The method according to claim 3, wherein said single write address and said single read address comprise numbers each of which is greater than or equal to 0 and less than or equal to a length of each of said plurality of line buffers.

5. The method according to claim 3, comprising inputting said single read address to each of said plurality of line buffers.

6. The method according to claim 3, comprising reading data output from a current one of said plurality of line buffers at a location based on said single read address during a current cycle of a system clock and writing at least a portion of said read data output to a subsequent one of said plurality of line buffers at a location based on said single write address during a subsequent cycle of said system clock.

7. The method according to claim 6, comprising incrementing said single write address during said current cycle of said system clock to generate said single write address during said subsequent cycle of said system clock.

8. The method according to claim 1, comprising concurrently inputting said single write address and/or said single write enable signal to each of said plurality of line buffers.

9. The method according to claim 1, comprising sending output data read from a last of said plurality of line buffers to a data destination external to said plurality of line buffers.

10. A system for a low cost line buffer, the system comprising: one or more circuits that enable concurrent transfer of data from of a plurality of line buffers to at least a subsequent one of said plurality of line buffers based on a single write address and a single write enable signal; wherein said at least a subsequent one of said plurality of line buffers receives said concurrently transferred data comprising at least a portion of read data output from a corresponding one of said each of at least a portion of said plurality of line buffers; wherein a width of at least one subsequent one of said plurality of line buffers is less than a width of any preceding one of said plurality of line buffers.

11. The system according to claim 10, comprising one or more circuits that enable reception of input data written to a first of said plurality of line buffers from a data source external to said plurality of line buffers.

12. The system according to claim 10, comprising one or more circuits that enable incrementing of said single write address to generate a single read address.

13. The system according to claim 12, wherein said single write address and said single read address comprise numbers each of which is greater than or equal to 0 and less than or equal to a length of each of said plurality of line buffers.

14. The system according to claim 12, comprising one or more circuits that enable input of said single read address to each of said plurality of line buffers.

15. The method according to claim 12, comprising one or more circuits that enable reading of data output from a current one of said plurality of line buffers at a location based on said single read address during a current cycle of a system clock and writing at least a portion of said read data output to a subsequent one of said plurality of line buffers at a location based on said single write address during a subsequent cycle of said system clock.

16. The system according to claim 15, comprising one or more circuits that enable incrementing of said single write address during said current cycle of said system clock to generate said single write address during said subsequent cycle of said system clock.

17. The system according to claim 10, comprising one or more circuits that enable concurrent input of said single write address and/or said single write enable signal to each of said plurality of line buffers.

18. The system according to claim 10, comprising one or more circuits that enable sending of output data read from a last of said plurality of line buffers to a data destination external to said plurality of line buffers.

* * * * *